United States Patent
Cheng

(10) Patent No.: US 7,528,035 B2
(45) Date of Patent: May 5, 2009

(54) VERTICAL TRENCH MEMORY CELL WITH INSULATING RING

(75) Inventor: Kangguo Cheng, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/688,562

(22) Filed: Mar. 20, 2007

(65) Prior Publication Data
US 2008/0230822 A1    Sep. 25, 2008

(51) Int. Cl.
*H01L 21/8242*    (2006.01)

(52) U.S. Cl. .................. 438/243; 438/270; 438/386; 257/E27.095

(58) Field of Classification Search ......... 438/243–249, 438/386–392, 268–272; 257/E27.095, E27.096
See application file for complete search history.

(56) References Cited

U.S. PATENT DOCUMENTS 5,302,541 A * 4/1994 Akazawa ................ 438/152
6,184,549 B1   2/2001  Furukawa et al.
6,414,347 B1   7/2002  Divakaruni et al.
6,566,177 B1   5/2003  Radens et al.
6,583,462 B1   6/2003  Furukawa et al.
6,833,305 B2   12/2004 Mandelman et al.

\* cited by examiner

*Primary Examiner*—H. Jey Tsai
(74) *Attorney, Agent, or Firm*—Rosa S. Yaghmour

(57) ABSTRACT

A method of forming a vertical transistor trench memory cell having an insulating ring is provided. The method includes forming a semiconductor material region in an etched portion of a semiconductor substrate; partially etching the semiconductor material region to form a deep trench, where the deep trench extends beyond the semiconductor material region, and where the remaining of the partially etched semiconductor material region defines an insulating ring. A vertical transistor is then formed in the deep trench, such that the vertical transistor is isolated by the insulating ring. A semiconductor structure is also provided. The semiconductor structure includes a first and a second trench memory cells formed on a semiconductor substrate; and an insulating ring surrounding each of the first and second trench memory cells. The insulating ring is configured for significantly enclosing out diffusions from the trench memory cells.

14 Claims, 6 Drawing Sheets

US 7,528,035 B2

VERTICAL TRENCH MEMORY CELL WITH INSULATING RING

BACKGROUND OF THE INVENTION

1. Technical Field

The present disclosure relates generally to semiconductor memories and, more particularly, to a vertical trench memory cell having an insulating ring.

2. Description of Related Art

Trench memory with a vertical transistor and a trench capacitor has been widely developed to provide an alternative path to scale the sizes of memory cells. For example, a dynamic random access memory (DRAM) is a capacitor for storing charge and a pass transistor (also called a pass gate or access transistor) for transferring charge to and from the capacitor. Data (i.e. 1 bit) stored in the cell is determined by the absence or presence of charge on the storage capacitor. As the minimum feature size of vertical DRAM arrays is scaled, cell-to-cell interaction becomes an increasing concern. Moreover, because cell size determines chip density, size and cost, reducing cell area is one of the DRAM's designer's primary goals. Typically, reducing cell area is done by reducing features size to shrink the cell.

Besides shrinking the cell features, the most effective means to reduce the cell area is to reduce the largest feature in the cell, typically, the area of the storage capacitor. However, shrinking the capacitor plate area reduces capacitance and, consequently, reduces stored charge. Reduced charge means that whatever charge is stored in the DRAM is more susceptible to noise, soft errors, leakage and other well known DRAM problems. Thus another primary goal for DRAM cell designers is to maintain storage capacitance while reducing cell area.

FIG. 1 illustrates a cross-sectional view of a conventional vertical transistor memory 10, which includes a trench capacitor 15 and vertical transistor 17. Trench capacitor 15 includes a first capacitor electrode 12 (e.g. a buried plate including a doped region in a substrate), a second capacitor electrode 13 (e.g. doped polysilicon inside the trench capacitor), and a node dielectric 14 (e.g. oxide, nitride and/or a high-k material). Vertical transistor 17 includes a gate electrode 23 (e.g. doped polysilicon inside the trench), a gate dielectric 22 (e.g. oxide) positioned on a trench sidewall, a first source/drain terminal 21 and a second source/drain terminal 28 (e.g. a doped outdiffusion regions 28a, 28b, 28c and 28d formed by diffusion of dopants from capacitor electrode 13 through a buried strap 18 (e.g. polysilicon)). Capacitor electrode 13 and gate electrode 23 are electrically insulated by a trench top oxide (TTO) insulator 20. Buried strap 18 and buried plate 12 are electrically insulated by a collar 16 (e.g. oxide). Transistor memory 10 includes an array of memory cells interconnected by bitlines or rows 24 and wordlines or columns 26. Strap outdiffusion regions 28a, 28b, 28c and 28d are formed by driving dopants in capacitor electrode 13 to diffuse through buried strap 18 during thermal processes.

When vertical transistor trench memory is used in an electrical circuit, it is usually desired to have each individual memory cell electrically isolated. However, as semiconductor device scales, vertical transistor memory is susceptible to the issue of merging buried strap outdiffusion (BSOD) of neighboring cells. For example, as illustrated in FIG. 1, strap outdiffusion region 28c of the memory cell on the left undesirably overlaps with strap outdiffusion region 28b of the memory cell on the right (indicated by reference numeral 30), resulting in electrical short of these two cells. As device feature sizes scale downward, the space between two neighboring trenches is reduced, thus aggravating the merging of strap outdiffusion regions 28b and 28c, as illustrated by the figure.

Accordingly, a need exists for forming vertical trench memory cell using alternative methods circumventing the limitations of downward scaling. The present disclosure provides a structure and method of forming a vertical transistor trench memory cell unreceptive to BSOD merging.

SUMMARY OF THE INVENTION

The present disclosure is directed to a structure and method of forming a vertical transistor trench memory cell structure having an insulating ring. In one embodiment, a method of forming a memory cell is described. The method includes forming a semiconductor material region in an etched portion of a semiconductor substrate; partially etching the semiconductor material region to form at least one deep trench, wherein the at least one deep trench extends beyond the semiconductor material region, and further wherein the remaining of the partially etched semiconductor material region defines an insulating ring; and forming a vertical transistor in the at least one deep trench, wherein at least a portion of the vertical transistor is isolated by the insulating ring. In one embodiment, the semiconductor material region is formed by epitaxial growth of silicon. In addition, the vertical transistor is isolated from an adjacent vertical transistor by the insulating ring. The method further includes forming at least one insulating spacer on a sidewall of the etched portion of the semiconductor substrate prior to the forming of the semiconductor material region. In one embodiment, the insulating ring includes the insulating spacer and the remaining of the partially etched semiconductor material region. The semiconductor substrate may be a layered wafer including a base substrate, an SOI layer and a buried oxide BOX layer isolating the SOI layer and the base substrate. In addition, the semiconductor substrate includes a hybrid orientated substrate.

In one particular embodiment, the vertical transistor is formed by forming a trench capacitor in a lower area of the deep trench; forming a buried strap adjacent to a portion of the trench capacitor; forming an insulator cap on a top surface of the buried strap; and forming a gate electrode on a top surface of the insulator cap. The buried strap outdiffuses into the semiconductor substrate such that the insulating ring significantly bounds the outdiffusion. The method further includes forming a first electrical contact for connecting to a source/drain region of the vertical transistor; and forming a second electrical contact for connecting to the gate electrode.

A second embodiment of a method of forming a memory cell in a layered semiconductor substrate includes etching a portion of the layered semiconductor substrate to form an insulating spacer on a trench sidewall; depositing a material layer on the etched portion; partially etching the material layer to form at least one deep trench region, wherein the at least one deep trench region extends beyond the material layer for defining an insulating ring in a portion of the at least one deep trench region; forming a trench capacitor in a lower area of the at least one deep trench region, wherein the forming the trench capacitor includes forming an insulating cap on a top portion of the trench capacitor; and forming a vertical transistor on a top surface of an insulating cap, wherein the vertical transistor is surrounded by the insulating ring. The method further includes forming a plurality of buried straps in the deep trench region, wherein the plurality of buried straps outdeffuses into the layered semiconductor substrate; and wherein the insulating ring significantly isolates the outdiffusion. In this particular embodiment, the material layer is an epitaxially growing silicon. The vertical transistor includes at least one of a gate electrode and a source/drain terminal.

A semiconductor structure is also described. The structure includes a first and a second trench memory cells formed on a semiconductor substrate, and an insulating ring surrounding each of the first and second trench memory cells, wherein the insulating ring is configured for significantly enclosing outdiffusion of the trench memory cells. In one embodiment, the first trench memory cell forms a first outdiffusion region and a the second trench memory cell forms a second outdiffusion region, wherein the insulating ring prevents the first outdiffusion region from merging with the second outdiffusion region. The insulating ring includes epitaxially grown silicon. In addition, the trench memory cell includes a vertical transistor overlaying a trench capacitor. The structure further includes a plurality of electrical contacts connected to the vertical transistor. In one particular embodiment, the first and second trench memory cells are adjacently formed in the semiconductor substrate and further wherein the insulating ring isolates each one of the first and second trench storage memory cells for insulating a buried strap outdiffusions from the first and second trench storage memory.

Other features of the presently disclosed structure and method of forming a vertical transistor trench memory cell structure with insulating ring will become apparent from the following detailed description taken in conjunction with the accompanying drawing, which illustrate, by way of example, the presently disclosed structure and method.

BRIEF DESCRIPTION OF THE DRAWINGS

The features of the presently disclosed structure and method of forming a vertical transistor trench memory cell structure with insulating ring will be described hereinbelow with references to the figures, wherein.

DETAILED DESCRIPTION

Figure 1:
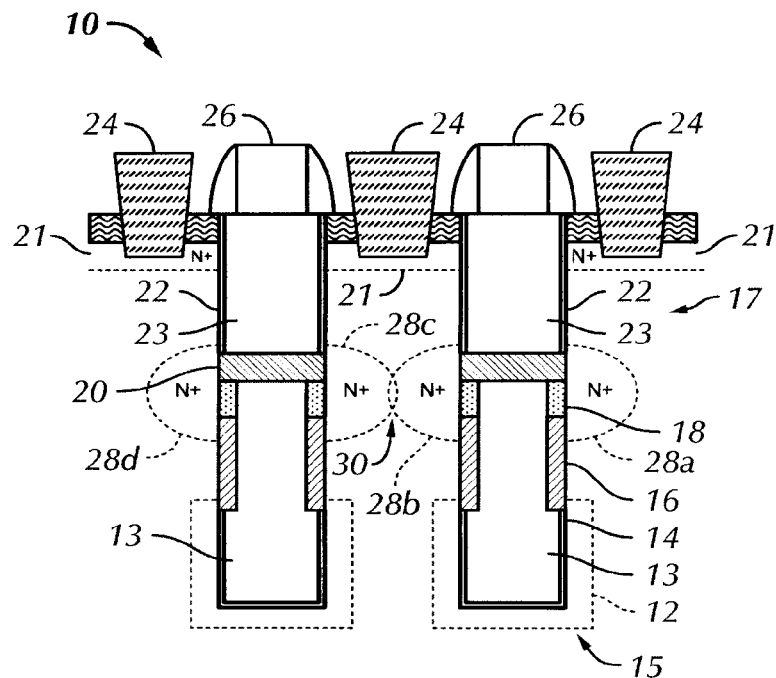
FIG. 1 illustrates a simplified cross-sectional view of a conventional vertical transistor memory structure formed on a semiconductor substrate.

Referring now to the drawing figures, wherein like references numerals identify identical or corresponding elements, an embodiment of the presently disclosed method of forming a vertical transistor trench memory cell structure with insulating ring will be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the invention.

FIGS. 2-11 illustrate an exemplary process of forming vertical transistor trench memory cells having an insulating ring for suppressing the merging of buried strap outdiffusion (BSOD), in manner described in detail hereinbelow. In particular, the vertical transistor trench memory cell is formed on a hybrid oriented substrate, wherein each BSOD is surrounded by an insulating ring. More in particular, a pad oxide layer is first formed over the device structure prior to patterning. One or more shallow trench areas are then formed in the pad oxide layer and through a portion of the device structure using conventional lithography and etching techniques. The shallow trench areas are then filled with epitaxial growth of silicon and the structure surface is then planarized using conventional processes. Using standard processes, deep trenches are then formed in the epitaxially grown silicon regions. Memory cells are then formed using standard processes well known in the art. Methods of forming vertical transistor trench memory are set forth in greater detail in commonly assigned U.S. Pat. No. 6,566,177 entitled "Silicon-on-insulator vertical array device trench capacitor DRAM" to Radens et al. and U.S. Pat. No. 6,833,305 entitled "Vertical DRAM punchthrough stop self-aligned to storage trench" to Mandelman et al., the disclosures of which are incorporated by reference herein in its entirety.

Figure 2:
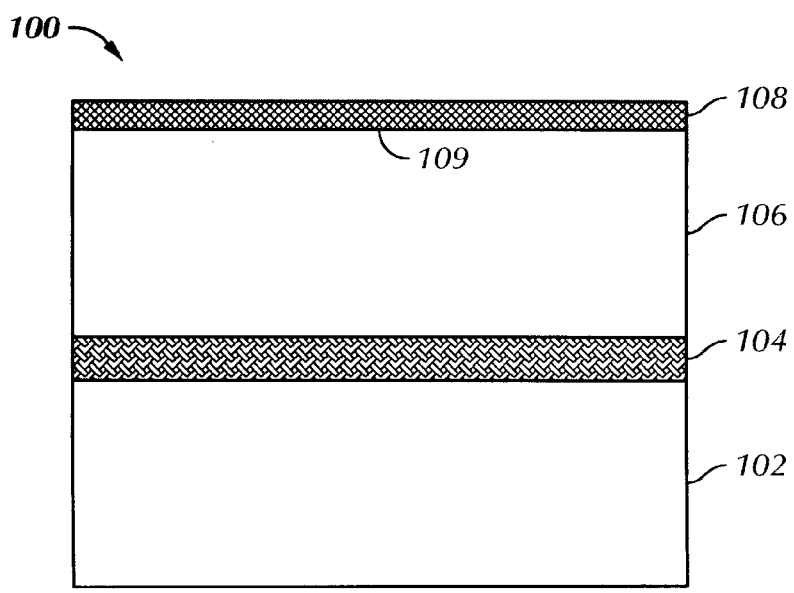
FIGS. 2-10 illustrate simplified cross-sectional views of a method of forming a vertical transistor trench memory cell structure in accordance with one embodiment of the present disclosure.

With initial reference to FIG. 2, an embodiment of a silicon-on-insulator (SOI) wafer, in accordance with the present disclosure, is illustrated and is designated generally as SOI wafer 100. SOI wafer 100 includes a base semiconductor substrate 102; a buried oxide (BOX) layer 104 formed on base semiconductor substrate 102; and a SOI layer 106 formed on BOX layer 104. Thus BOX layer 104 isolates SOI layer 106 from base semiconductor substrate 102. A pad layer 108 is formed on a top surface 109 of SOI layer 106.

Base semiconductor substrate 102 may include any of several semiconductor materials well known in the art, such as, for example, a bulk silicon substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium arsenide, indium arsenide and indium phosphide semiconductor material. Typically, base semiconductor substrate 102 may be about, but is not limited to, several hundred microns thick. For example, base semiconductor substrate 102 may include a thickness ranging from about 0.5 mm to about 1.5 mm.

BOX layer 104 may be formed from any of several dielectric materials. Non-limiting examples include, for example, oxides, nitrides and oxynitrides of silicon. Oxides, nitrides and oxynitrides of other elements are also envisioned. In addition, BOX layer 104 may include crystalline or non-crystalline dielectric material. Moreover, BOX layer 104 may be formed using any of several methods. Non-limiting examples include ion implantation methods, thermal or plasma oxidation or nitridation methods, chemical vapor deposition methods and physical vapor deposition methods. Typically, BOX layer 104 includes an oxide of the semiconductor from which base semiconductor substrate 102 is comprised. In one embodiment, BOX layer 104 includes a thickness of about 300 nm. Alternatively, BOX layer 104 may include a thickness ranging from about 10 nm to about 500 nm. Furthermore, the thickness of BOX 104 may be selected by adjusting ion implantation does and energy.

SOI layer 106 may include any of the several semiconductor materials included in base semiconductor substrate 102. In general, base semiconductor substrate 102 and SOI layer 106 may include either identical or different semiconductor materials with respect to chemical composition, dopant concentration and crystallographic orientation. In one particular embodiment of the present disclosure, base semiconductor substrate 102 and SOI layer 106 include semiconductor materials that include at least different crystallographic orientations. Typically one of base semiconductor substrate 102 and SOI layer 106 includes a {110} crystallographic orientation and the other of base semiconductor substrate 102 and SOI layer 106 includes a {100} crystallographic orientation. Typically, SOI layer 106 includes a thickness ranging from about 5 nm to about 100 nm.

Pad layer 108 includes an insulating material such as, for example, silicon nitride. Pad layer 108 may be formed using conventional lithographic patterning methods, for example, low-pressure chemical vapor deposition (LPCVD) and depositing SiN of a thickness ranging from about 10 nm to about 500 nm. In one particular embodiment, pad nitride layer 108 includes a thickness of about 100 nm. Optionally, a thin (2 nm to 10 nm, preferably 5 nm) thermal oxide layer (not shown) may be formed on SOI layer 106 prior to forming pad nitride layer 108.

Figure 3:
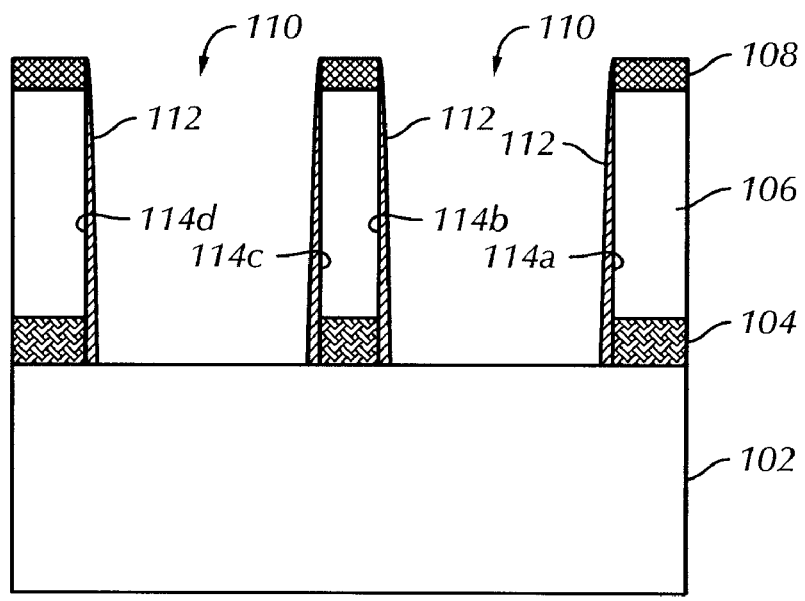

With reference to FIG. 3, cell locations are identified and a mask layer (not shown) of a suitable masking material is deposited on pad layer 108 and patterned using a conventional photolithography technique. The mask layer includes suitable masking materials such as, for example, photoresist or hardmask such as silicon dioxide. Trenches 110 are then defined and formed by etching through pad layer 108, SOI layer 106, BOX layer 104, and stopping at base semiconductor layer 102. Trenches 110 are formed using, for example, an anisotropic dry etch technique, such as reactive ion etch (RIE). The mask layer may be removed after trenches 110 are defined, or, alternatively, in a later process.

With continued reference to FIG. 3, protective insulating spacers 112 are formed along each sidewalls 114a, 114b, 114c and 114d of etched trenches 110 by conformally depositing a thin insulator layer using LPCVD then performing an anisotropically dry etched, for example, a reactive ion etch (RIE) process. Suitable insulator layers may include silicon oxide or silicon nitride. It is envisioned that insulator spacers 112 protect trench sidewalls 114a, 114b, 114c and 114d of SOI layer 106 and BOX layer 104 during subsequent processing steps.

Figure 4:
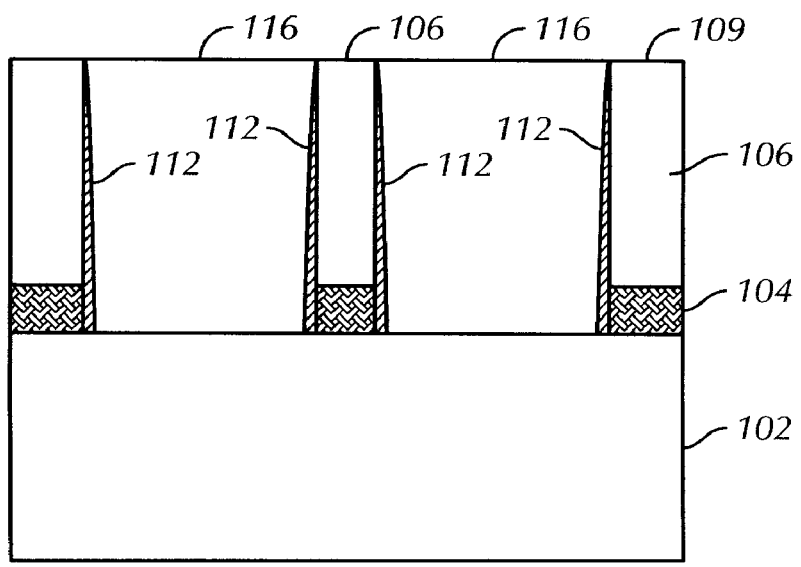

With reference to FIG. 4, in conduction with FIGS. 2 and 3, trenches 110 are then filled with a material layer to form semiconductor regions 116. In one embodiment, semiconductor regions 116 are formed by epitaxial growth of silicon. A surface of SOI wafer 100 is then planarized using a conventional planarization process, such as, for example, chemical mechanical process (CMP). A top surface of semiconductor regions 116 may be adjusted to be co-planar with top surface 109 of SOI layer 106. For example, a thermal oxidation followed by oxide trench may be performed to adjust the height of the surface and to remove any defects (e.g. CMP scratches, etc.) In one embodiment, pad layer 108 is stripped before the planarization process. Alternatively, pad layer 108 may be stripped after the planarization process.

Figure 5:
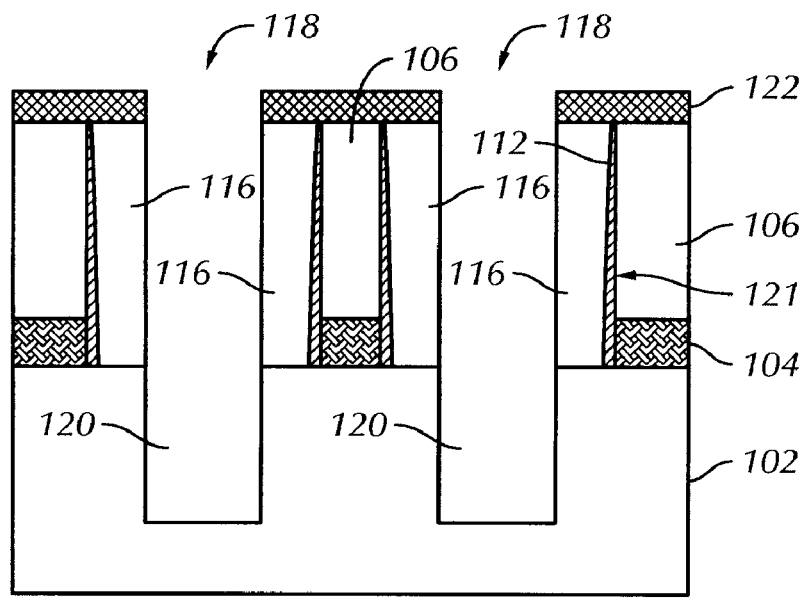

With reference to FIG. 5, a pad layer 122 and a hardmask layer (e.g., oxide, not shown) are sequentially deposited on a surface of the planarized structure shown in FIG. 4. The hardmask layer is patterned using a conventional photolithography technique. Subsequently, semiconductor regions 116 are partially etched using, for example, RIE, for forming deep trenches 118 and for defining insulating ring 121. The hardmask is then removed using, for example, a hydrofluoric acid solution. Insulating ring 121 includes insulating spacer 112 and a portion of semiconductor region 116. In particular, insulating ring 121 is configured for suppressing the merging of buried strap outdiffusion, in a manner described in detailed hereinbelow. It is noted that deep trenches 118 includes a lower trench area 120 etched into a portion of base semiconductor substrate 102 to a full depth from about 3 μm to about 10 μm. In one particular embodiment, deep trenches 118 include a depth of about 6 μm.

Figure 6:
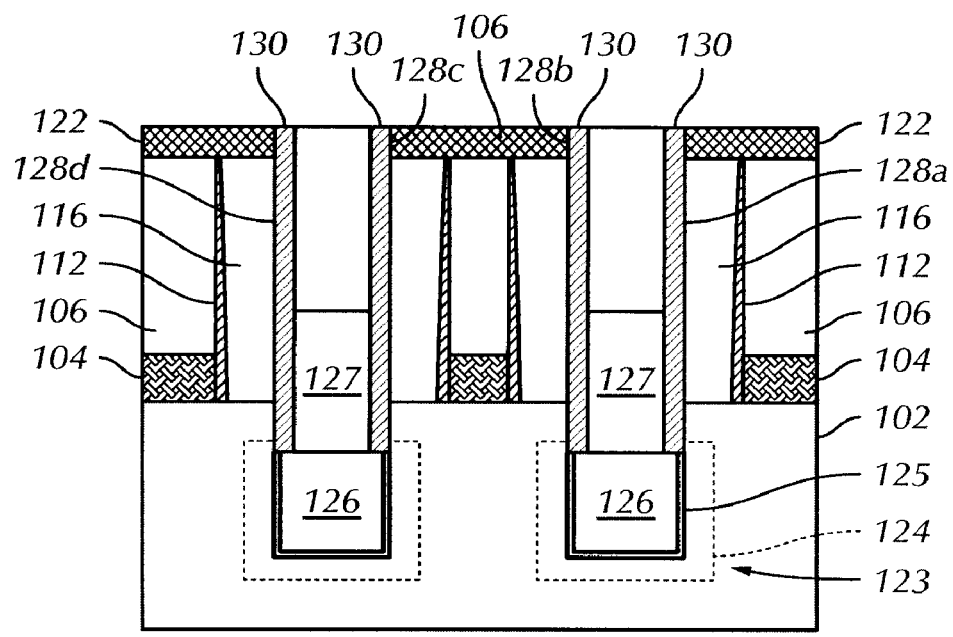

With reference to FIGS. 6-10, transistor trench memory cells are then formed in deep trenches 118 using standard processes such as, for example, the one described in commonly assigned U.S. Pat. No. 6,566,177 to Radens et al. and U.S. Pat. No. Mandelman et al., the disclosure of both patents are incorporated by reference herein in its entirety. With particular reference to FIG. 6, a trench capacitor 123 is formed in lower trench area 120 of deep trenches 118. Trench capacitor 123 includes a buried capacitor plate 124, a node dielectric 125 and a second capacitor plate 126. Buried plate 124 is formed in base layer 102 by any known process, including, but not limited to, ion implantation, gas phase doping, plasma doping, plasma immersion ion implantation, infusion doping, liquid phase doping, solid phase doping, etc. Optionally, the trench volume may be expanded below BOX layer 104 to form bottle shaped trenches before or after the formation of buried plate 124. Node dielectric 125 (e.g. oxide, nitride, oxynitride and/or high-k materials) is formed by any suitable process such as thermal oxidation thermal nitridation, atomic layer deposition, chemical vapor deposition, etc. Second capacitor plate 126 is formed by filling trench 118 with a conducting material. In one embodiment, the conductive material includes doped polycrystalline silicon formed by low pressure chemical vapor deposition. Alternatively, the conductive material may comprise other conducting material such as germanium, silicon germanium, a metal (e.g. tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), or any suitable combination of these materials.

With continued reference to FIG. 6, an insulating collar 130 is formed vertically along sidewalls 128a, 128b, 128c and 128d of deep trenches 118 and above second capacitor plate 126 of trench capacitor 123. In particular, insulating collar 130 is formed by first recessing the conductive material to a pre-determined depth, optionally removing the exposed node dielectric 125, depositing an insulator material, and then removing the insulator material on a top surface of second capacitor plate 126 using, for example, RIE. In one embodiment, insulating collar 130 includes an oxide. Deep trenches 118 are then filled with a second conducting material 127. Second conducting material 127 is then recessed to a predetermined depth to expose a portion of insulating collar 130. Second conducting material 127 may include doped polycrystalline silicon formed by low pressure chemical vapor deposition. Alternatively, second conducting material 127 may comprise other conducting material such as germanium, silicon germanium, a metal (e.g. tungsten, titanium, tantalum, ruthenium, cobalt, copper, aluminum, lead, platinum, tin, silver, gold), a conducting metallic compound material (e.g., tantalum nitride, titanium nitride, tungsten silicide, tungsten nitride, titanium nitride, tantalum nitride, ruthenium oxide, cobalt silicide, nickel silicide), or any suitable combination of these materials. In yet another embodiment, second conducting material 127 includes doped polycrystalline silicon formed by low pressure chemical vapor deposition.

Figure 7:
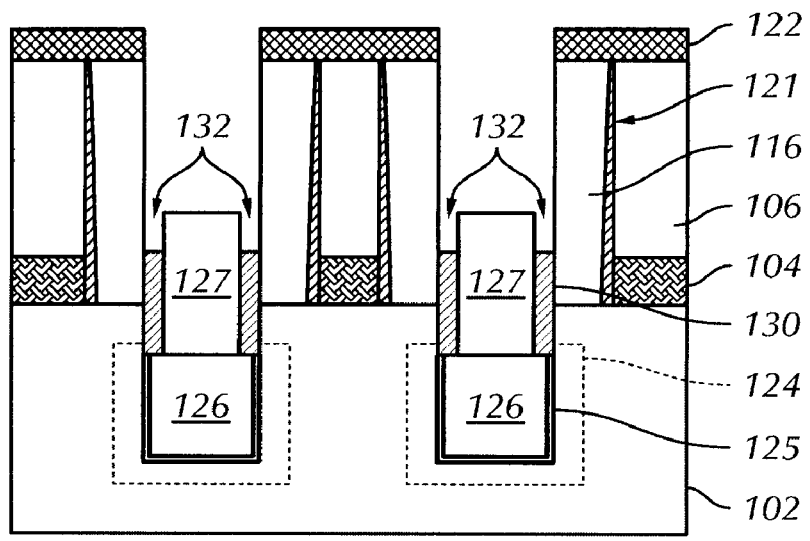

With reference to FIG. 7, a portion of collar 130 is partially etched for forming divots 132 along second conductive material 127. In one embodiment, insulating collar 130 is an oxide.

An aqueous etchant including a hydrofluoric acid may be used during the partial etching of insulating collar 130.

Figure 8:
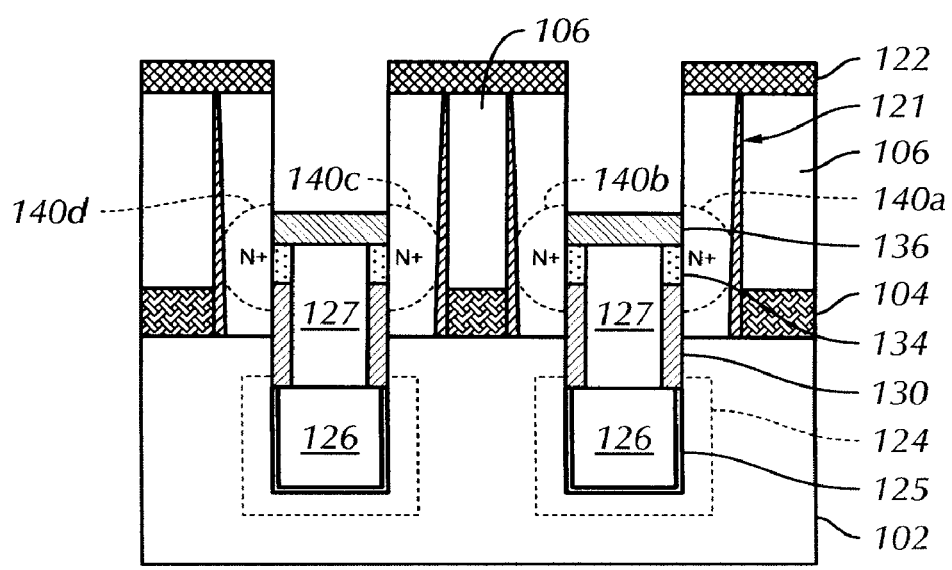

With reference to FIG. 8, divots 132 are filled with a conducting material for forming buried straps 134 adjacent to a portion of second conductive material 127. Buried straps 134 may include polycrystalline silicon. In addition, buried straps 134 may be include a doped or undoped material. In one embodiment, a thin nitride (not shown) with a thickness less than 1 nanometer may be deposited before divots 132 are filled. An insulator cap 136 is then formed on a top surface of buried straps 134. In one embodiment, insulator cap 136 includes an oxide, usually referred to as trench top oxide (TTO). Insulator cap 136 (i.e. TTO) may be formed by high density plasma deposition followed by an etch-back process.

With continued reference to FIG. 8, and as discussed hereinabove, dopants in conducting material 127 and/or buried straps 134 may diffuse into the substrate during a subsequent thermal process, thus forming buried strap outdiffusion (BSOD) 140a, 140b, 140c, and 140d. However, since conducting material 127 and buried straps 134 are surrounded by insulating ring 121, the occurrence of merging of outdiffusion 140a, 140b, 140c and 140d, present in the prior art, is significantly reduced.

Figure 9:
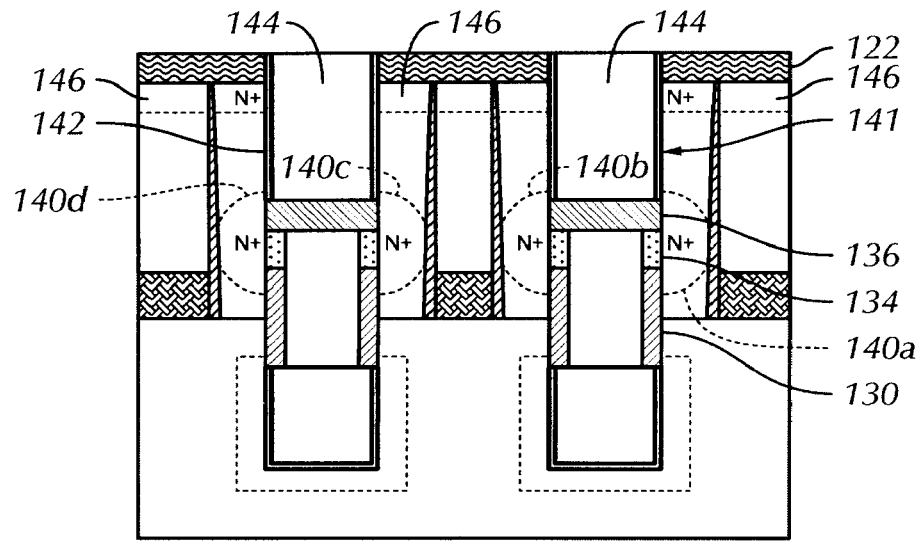

With reference to FIG. 9, a vertical transistor 141 is formed above insulator cap 136. Vertical transistor 141 includes a gate dielectric 142, a gate electrode 144, a first source/drain terminal 146 and second source/drain BOSD 140a, 140b, 140c, and 140d. In particular, gate dielectric 142 is formed on a trench sidewall of insulating ring 121 (i.e. deep trenches 118). Gate dielectric 142 may include any suitable dielectric material, including but not limited to, oxide, nitride, oxynitride, high-k materials, and any combination of these materials. Processes for forming gate dielectric 142 include but are not limited to, thermal oxidation, thermal nitridation, atomic layer deposition, chemical vapor deposition, or any suitable combination of these techniques.

Gate electrode 144 may be formed by filling trenches 118 with a conducting material including, but not limited to, any conducting material described hereinabove for second conducting material 127. Moreover, gate electrode 144 may be formed by any suitable deposition method described hereinabove. In one embodiment, gate electrode 144 includes doped polycrystalline silicon formed by low pressure chemical vapor deposition. First source/drain terminal 146 is formed by ion implantation. In particular, Pad layer 122 may be replaced by an insulator layer (not shown) at any suitable process step. For example, the pad layer 122 may be stripped after the formation of gate electrode 144 and an oxide layer may be deposited to form the insulating layer.

Figure 10:
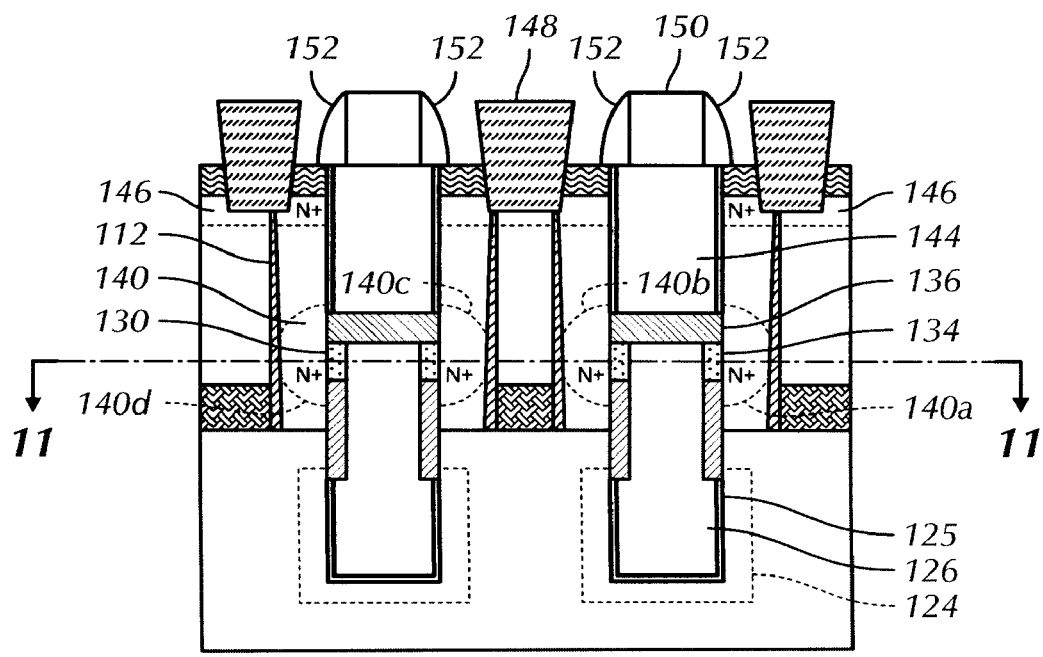

With reference to FIG. 10, a first contact 148 is formed for electrically connecting to first source/drain region 146 and a second contact 150 is formed at top of the gate electrode 144. Contacts 148 and 150 may include any conducting material formed by any method described hereinabove. An insulating spacer 152 can be formed to further electrically isolate first and second contacts 148 and 150. Spacer 152 may includes oxide and/or nitride formed by deposition and RIE.

Figure 11:
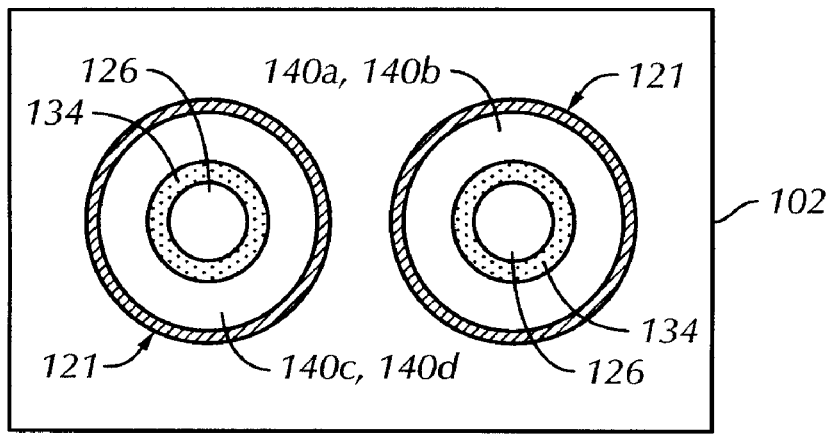
FIG. 11 illustrates a simplified cross-sectional top view of the vertical transistor trench memory cell structure taken along section line 11-11 of FIG. 10.

With reference to FIG. 11, a simplified plan view taken along sectional line 11-11 in FIG. 10 in the buried strap region is illustrated. Each vertical transistor is isolated from its neighbors by insulating spacer ring 121. In one embodiment, and as illustrated by the figure, BSOD 140a, 140b, 140c and 140d are surrounded by an insulating ring 121. Thus BSOD 140a, 140b, 140c and 140d are precluded from merging.

Figure 12:
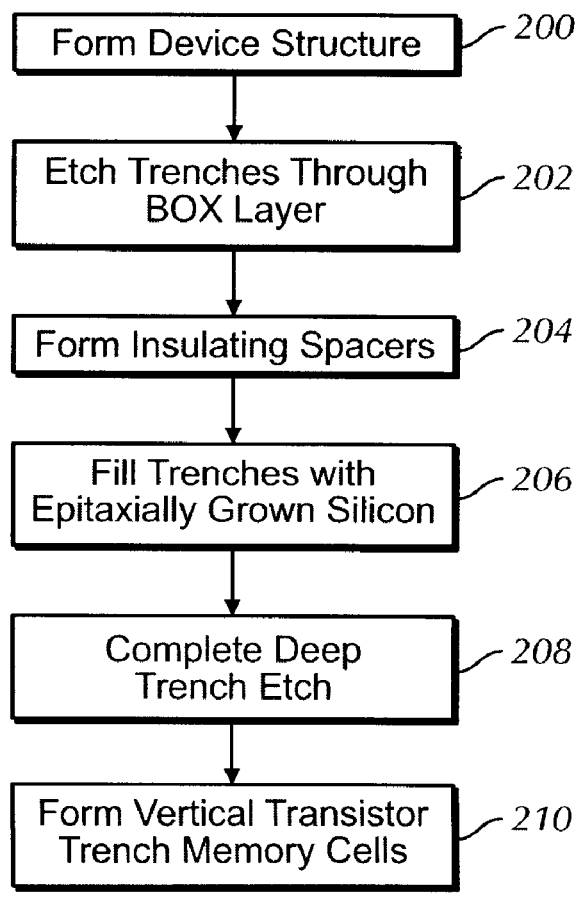
FIG. 12 is an exemplary flow diagram illustrating a method of forming a vertical transistor trench memory cell structure, in accordance with one embodiment of the present disclosure.

With reference to FIG. 12, in conjunction with FIGS. 2-11, a flow diagram of an exemplary method of forming a vertical transistor trench memory, in accordance with the present disclosure, is illustrated. Initially, at step 200, a device structure, such as, for example an SOI wafer 100 is formed having a silicon base layer 102, a BOX layer 104 and a SOI layer 106, as discussed hereinabove. In accordance with the present disclosure, at step 202, a trench location pattern is formed using a typical photolithographic process. Trenches are partially etched into the device structure. At step 204, insulating spacers are formed along the sidewall of the partially etched trenches to protect the SOI layer sidewalls. Insulating spacer may include nitride, oxide, oxynitride, or a combination thereof. At step 206, the trenches are filled by epitaxially grown silicon. At step 208, deep trenches are completed, etching into the silicon base layer to the full trench depth. Optionally, the trench volume is expanded below the BOX layer to form bottle shaped trenches. Finally, at step 210, a plurality of vertical transistor trench memory cells are formed using conventional steps, such as the one described in U.S. Pat. No. 6,566,177 to Radens et al.

The above described method enables scaling of vertical transistors by completely preventing BSOD merging. No deep isolation (e.g. shallow trench isolation) is necessary as each vertical transistor is isolated from neighboring cells by insulating ring 121. In use, when the transistors are used along with the trench capacitors to form trench memory cells, BSOD the merging of BSOD 140a, 140b, 140c and 140d are completely suppressed.

It will be understood that numerous modifications and changes in form and detail may be made to the embodiments of the presently disclosed structure and method of forming vertical trench memory cell structures. It is contemplated that numerous other configuration of the SOI wafer 100 may be used, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. Having thus complied with the details and particularity required by the patent laws, what is claimed and desired protected is set forth in the appended claims.

What is claimed is:

1. A method of forming a memory cell, the method comprising:
    forming a semiconductor material region in an etched portion of a semiconductor substrate;
    partially etching said semiconductor material region to form at least one deep trench, wherein said at least one deep trench extends beyond said semiconductor material region, and further wherein the remaining of said partially etched semiconductor material region defines an insulating ring; and
    forming a vertical transistor in said at least one deep trench, wherein at least a portion of said vertical transistor is isolated by said insulating ring.

2. The method of forming a memory cell as recited in claim 1, wherein said semiconductor material region is formed by epitaxial growth of silicon.

3. The method of forming a memory cell as recited in claim 1, wherein said vertical transistor is isolated from an adjacent vertical transistor by said insulating ring.

4. The method of forming a memory cell as recited in claim 1, further comprising forming at least one insulating spacer on a sidewall of said etched portion of said semiconductor substrate prior to said forming of said semiconductor material region.

5. The method of forming a memory cell as recited in claim 4, wherein said insulating ring includes said insulating spacer and said remaining of said partially etched semiconductor material region.

6. The method of forming a memory cell as recited in claim 1, wherein said forming a vertical transistor includes:
   forming a trench capacitor in a lower area of said deep trench;
   forming a buried strap adjacent to a portion of said trench capacitor;
   forming an insulator cap on a top surface of said buried strap; and
   forming a gate electrode on a top surface of said insulator cap.

7. The method of forming a memory cell as recited in claim 6, wherein said buried strap outdiffuses into said semiconductor substrate and further wherein said insulating ring significantly bounds said outdiffusion.

8. The method of forming a memory cell as recited in claim 6, further comprising;
   forming a first electrical contact for connecting to a source/drain region of said vertical transistor; and
   forming a second electrical contact for connecting to said gate electrode.

9. The method of forming a memory cell as recited in claim 1, wherein said semiconductor substrate includes a hybrid orientated substrate.

10. The method of forming a memory cell as recited in claim 1, wherein said semiconductor substrate includes a base semiconductor substrate, a buried oxide layer formed on said base semiconductor substrate; and a silicon-on-insulator layer formed on said buried oxide layer.

11. A method of forming a memory cell in a layered semiconductor substrate, the method comprising:
   etching a portion of said layered semiconductor substrate to form an insulating spacer on a trench sidewall;
   depositing a material layer on said etched portion;
   partially etching said material layer to form at least one deep trench region, wherein said at least one deep trench region extends beyond said material layer for defining an insulating ring in a portion of said at least one deep trench region;
   forming a trench capacitor in a lower area of said at least one deep trench region, wherein said forming said trench capacitor includes forming an insulating cap on a top portion of said trench capacitor; and
   forming a vertical transistor on a top surface of an insulating cap, wherein said vertical transistor is surrounded by said insulating ring.

12. The method of forming a memory cell as recited in claim 11, wherein said material layer is an epitaxially growing silicon.

13. The method of forming a memory cell as recited in claim 11, wherein said vertical transistor includes at least one of a gate electrode and a source/drain terminal.

14. The method of forming a memory cell as recited in claim 11, further comprising forming a plurality of buried straps in said deep trench region,
   wherein said plurality of buried straps outdeffuses into said layered semiconductor substrate; and
   wherein said insulating ring significantly isolates said outdiffusion.

* * * * *